United States Patent
Luo et al.

(10) Patent No.: US 7,137,079 B2
(45) Date of Patent: Nov. 14, 2006

(54) MEMORY COMPILER WITH ULTRA LOW POWER FEATURE AND METHOD OF USE

(75) Inventors: Ruei-Chin Luo, Hsin-Chu (TW); Hung-Jen Liao, Hsin-Chu (TW)

(73) Assignee: Taiwan Semiconductor Manufacturing Co., Ltd., Taiwan (CN)

(*) Notice: Subject to any disclaimer, the term of this patent is extended or adjusted under 35 U.S.C. 154(b) by 212 days.

(21) Appl. No.: 10/752,116

(22) Filed: Jan. 6, 2004

(65) Prior Publication Data
US 2005/0149891 A1   Jul. 7, 2005

(51) Int. Cl.
G06F 17/50 (2006.01)
(52) U.S. Cl. .................. 716/1; 716/3; 716/18
(58) Field of Classification Search .......... 716/1, 716/3, 4, 18; 711/4, 100, 102, 104, 105; 365/226–229
See application file for complete search history.

(56) References Cited

U.S. PATENT DOCUMENTS

| | | | |
|---|---|---|---|
| 6,295,627 B1 * | 9/2001 | Gowni et al. | 716/1 |
| 6,453,448 B1 * | 9/2002 | Meyer | 716/4 |
| 2005/0071693 A1 * | 3/2005 | Chun et al. | 713/300 |

* cited by examiner

*Primary Examiner*—Vuthe Siek
(74) *Attorney, Agent, or Firm*—Duane Morris LLP

(57) ABSTRACT

The present invention relates to a method of creating a design for a semiconductor memory. In an embodiment, a memory compiler for a semiconductor memory has access to a set of leaf cell designs for use by the memory compiler, the leaf cell designs comprising a power management circuit design as a leaf cell for a memory circuit. A user may elect to allow enablement of an ultra low power feature and the memory compiler creates a design which incorporates the power management circuit in a compiled semiconductor memory macro when the user-selectable option is enabled.

10 Claims, 4 Drawing Sheets

MEMORY COMPILER WITH ULTRA LOW POWER FEATURE AND METHOD OF USE

FIELD OF INVENTION

The present invention relates generally to the field of design of semiconductor devices. More specifically, the present invention relates to memory compilers.

BACKGROUND OF THE INVENTION

Semiconductor memory blocks can be well defined and separated out from a system much more easily than can other components of other semiconductors. Because of the stand-alone nature of memory blocks, many semiconductor memory developers outsource designing memory modules. The modular nature of memory blocks and the demand for embedded memories, as well as the fact that the memory core may utilize new technologies in which the system design team lacks design expertise, have all resulted in the growth of use of memory compilers.

The first published static random access memory (SRAM) compiler, known as RAMGEN, was developed at Texas Instruments® in 1986 and was strictly a layout generator. This tool simply connected previously designed leaf cells into a parameterized static random access memory ("SRAM") configuration that could be fabricated with either a 2.0 or 3.0 μm complementary metal-on-silicone (CMOS) process. Since that time, numerous SRAM compilers have been developed.

Designing for the lowest power requires small cells. Adding peripheral circuits such as self-timed clocking, clock-partitioning, reduced bit-line swing, and array banking circuits may aid in delivery of the lowest possible power. End of cycle shut-off logic and the addition of a memory disable pin may also ensure zero quiescent current regardless of the state of the clock or input pins facilitating very low power consumption when the memory is idle.

As used with memory compilers, a leaf cell is typically defined as a cell that contains a transistor or transistor cell. Except for the memory cell, all leaf cells are typically laid out once the design is complete. Power and feedthroughs are typically included in the leaf cell.

DETAILED DESCRIPTION OF AN EXEMPLARY EMBODIMENT OF THE INVENTION

Figure 1:
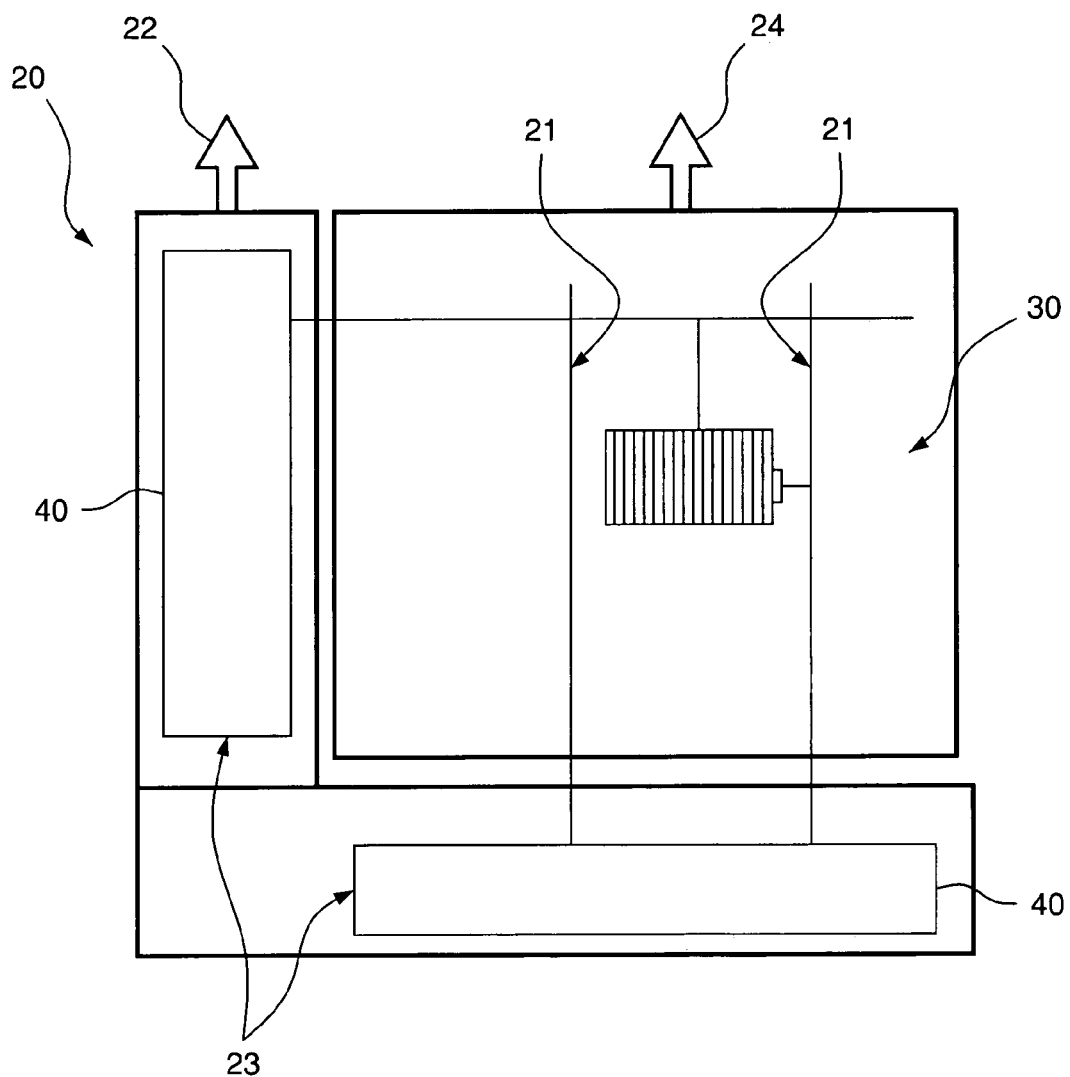
FIG. 1 is a schematic overview of a circuit design.

Referring now to FIG. 1, electronic circuit design 20 is constructed from leaf cells adapted to reduce leakage power resulting of a circuit, e.g. a semiconductor memory circuit, resulting from use of the memory compiler 10 (not shown in the figures). In an embodiment, electronic circuit design 20 comprises first control voltage power supply 22 to a circuit peripheral to memory cell array 30, e.g. circuit 40, and second control voltage power supply 24 to memory cell array 30. First control voltage power supply 22 may be separate from second control voltage power supply 24 such that a first control supply voltage of memory periphery circuit 30 may be separated from a second control supply voltage for memory cell 30.

First control voltage power supply 22 may comprise a voltage design useful to supply a control supply voltage for a memory periphery circuit such as 40, e.g. a row address decoder or input/output circuitry.

Second control voltage power supply 24 may comprise a voltage design useful to supply a control supply voltage of memory cell 30. Second control voltage power supply 24 may comprise a variable voltage supply.

Memory cell array 30 may be a semiconductor memory, for example static random access memory, read only memory, embedded flash memory, 1T-static random access memory, or the like. Address lines, e.g. 21, may be present in memory cell array 30 as may be additional circuitry, e.g. circuits 23.

Figure 2:
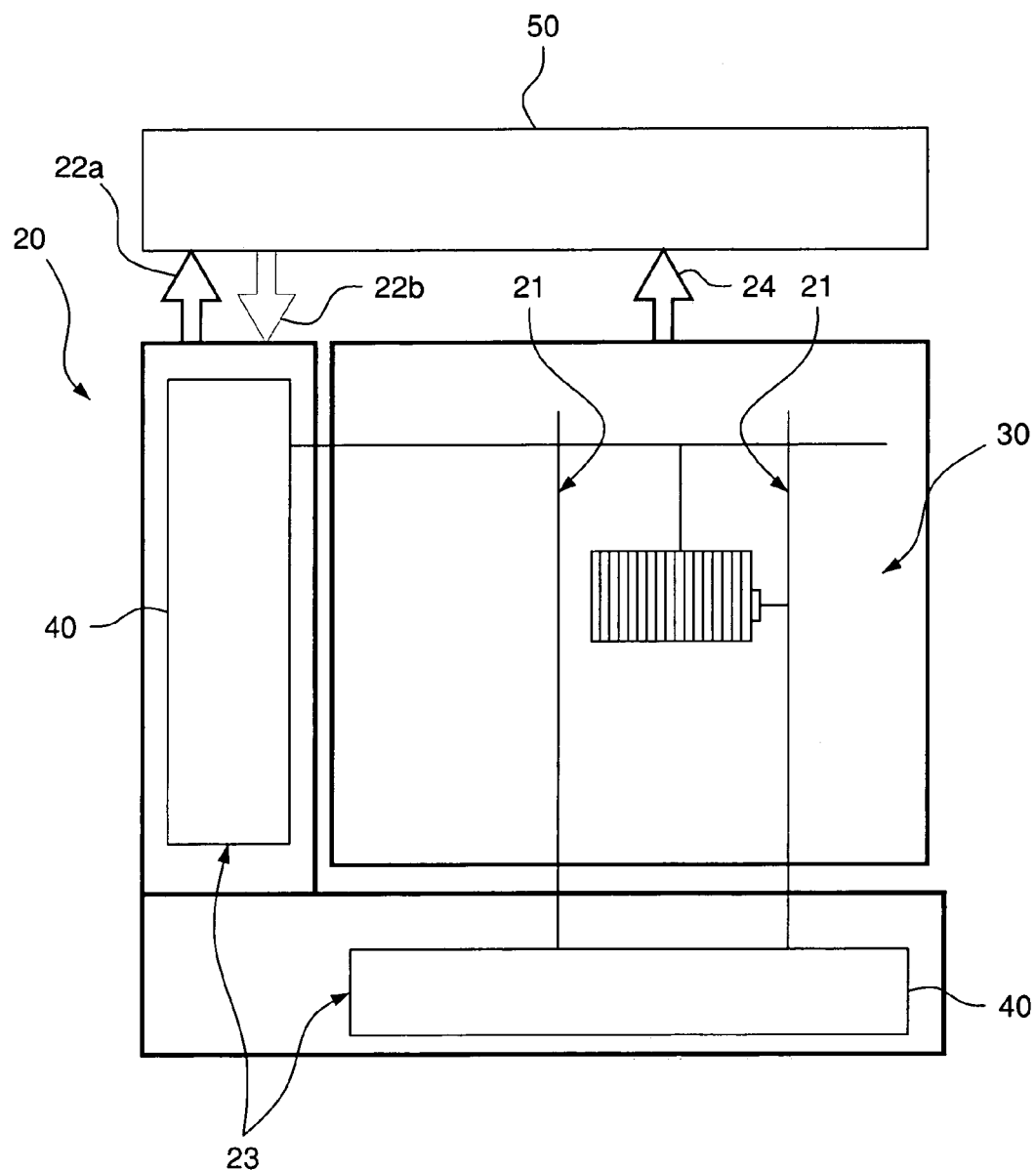
FIG. 2 is a schematic overview of a circuit design with a low power option.

Referring now to FIG. 2, in an embodiment a user may elect to add power management circuit 50 as a leaf cell. Using power management circuit 50, first control voltage power supply 22 may further comprise voltage supply 22a and control signal 22b. Voltage supply 22a may comprise a variable voltage supply which may further provide a substantially zero voltage.

Figure 3:
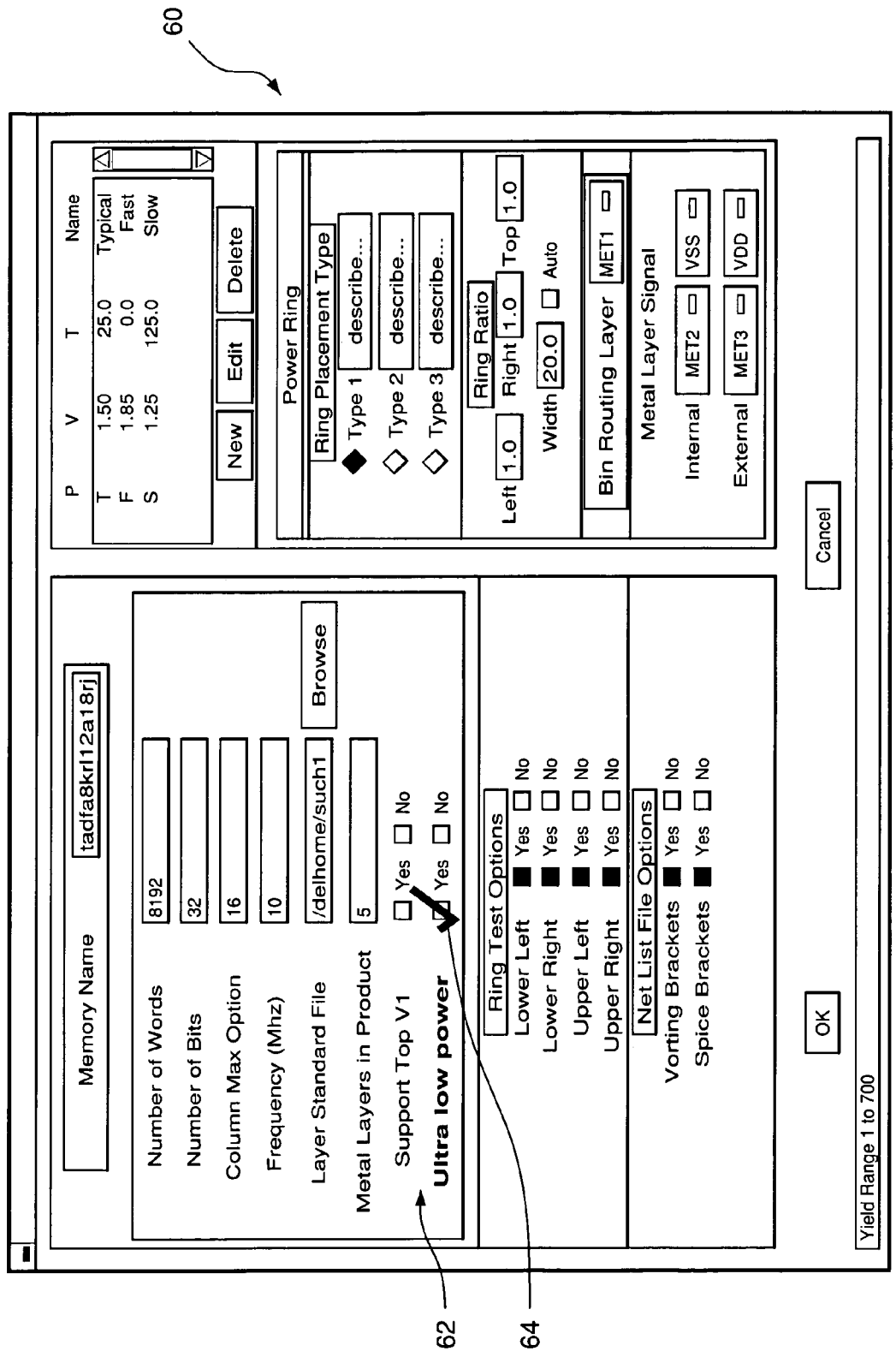
FIG. 3 is an illustration of an exemplary user interface.

Referring now to FIG. 3, graphical user interface 60, displayable on a computer display, may be present and configured to allow a user to specify one or more parameters for electronic circuit design 20 (FIG. 2) which includes power management circuit 50 (FIG. 2) as a leaf cell for electronic circuit design 20. Region 62 may be present on a visually perceptible display accessible by the user of a computer system, where region 62 may comprise user selectable option 64 to allow the user to specify selection or deselection of an ultra low power feature of circuit design 20 where power management circuit 50 is a leaf cell.

Figure 4:
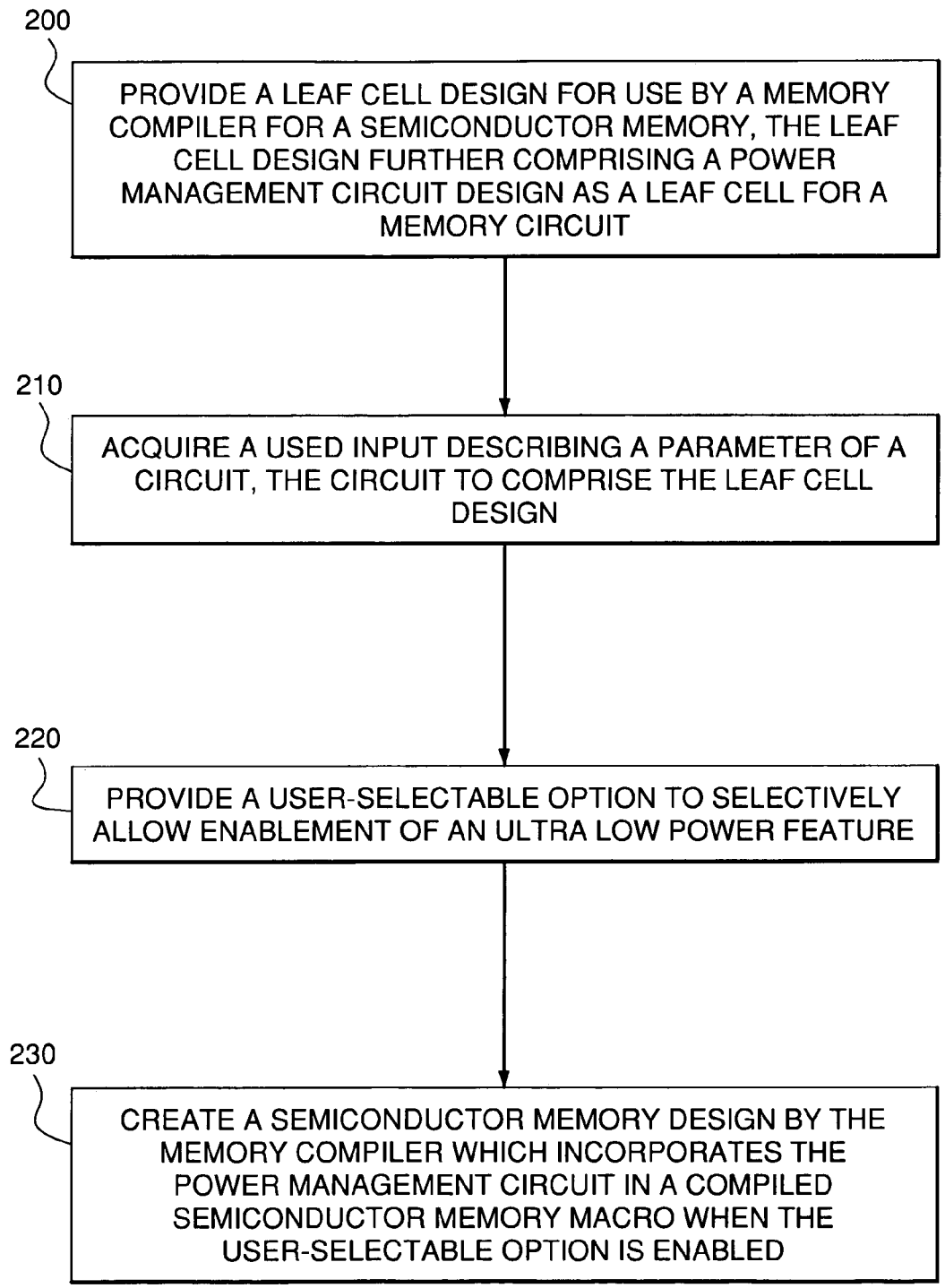
FIG. 4 is a flowchart of an exemplary method.

In the operation of an exemplary embodiment, referring now to FIG. 4, in an embodiment, a user invokes memory compiler 10 to create a design for an electronic circuit 20, e.g. a semiconductor memory or other electronic circuit, where electronic circuit 20 will be created using the design created by memory compiler 10.

The user is provided with a set of leaf cell designs for use by the user where the leaf cell designs comprise power management circuit design 50 as a leaf cell for memory circuit 20, step 200. Memory compiler 10 acquires a set of user inputs describing parameters of memory circuit 20 to comprise at least one leaf cell design of the set of the leaf cell designs, step 210. This acquisition may be via a batch method such as from a predefined set of parameters, an interactive method such as using user interface 60 (FIG. 3), or the like, or a combination thereof.

In an embodiment, the user may be provided with a user-selectable option to selectively allow enablement of an ultra low power feature such as is illustrated in FIG. 3 using user interface 50, step 220.

Memory compiler 10 may then use the user inputs and parameters to provide a design which incorporates power management circuit 50 in a compiled semiconductor memory macro when the user-selectable option is enabled, step 230.

A netlist identifier, which may be unique with respect to a netlist identifier for the control supply voltage of memory cell 30 (FIG. 1), may be provided to the control supply voltage of memory peripherial circuit 40 (FIG. 1). For example, first control voltage power supply 22 may be identified as "VDD" and second control voltage power supply 24 may be identified as "CVDD."

The user may elect to provide second control voltage power supply 24 (FIG. 2) as a variable voltage supply. In this embodiment, second control voltage power supply 24 may be allowed to operate in a minimum voltage level capable of sustaining data in memory cell 30 (FIG. 2). Further, second control voltage power supply 24 may be allowed to have a substantially zero voltage, e.g. in a static mode.

It will be understood that various changes in the details, materials, and arrangements of the parts which have been described and illustrated above in order to explain the nature of this invention may be made by those skilled in the art without departing from the principle and scope of the invention as recited in the appended claims.

What is claimed is:

1. A method of creating a design for a semiconductor memory and an associated memory cell array, comprising:
    a. providing a leaf cell design for use by a memory compiler for a semiconductor memory, the leaf cell design further comprising a power management circuit design as a leaf cell for a memory circuit and a control supply voltage;
    b. acquiring a user input describing a parameter of a circuit, the circuit to comprise the leaf cell design;
    c. providing a user-selectable option to selectively allow enablement of an ultra low power feature; and
    d. creating a semiconductor memory design by the memory compiler which incorporates the power management circuit in a compiled semiconductor memory macro when the user-selectable option is enabled
    wherein the control supply voltage includes a netlist identifier which is unique with respect to a netlist identifier for a control supply voltage of the memory cell array.

2. The method of claim 1, wherein the memory compiler is adapted to create a design for at least one of (1) a static random access memory, (ii) a read only memory, (iii) an embedded flash memory, or (iv) a single transistor random access memory.

3. The method of claim 1, wherein the power management circuit design is adapted to reduce leakage power resulting from a circuit resulting from use of the memory compiler.

4. The method of claim 1, wherein the power management circuit design further comprising a first control voltage power supply for providing power to a circuit peripheral and a second control voltage power supply for providing power to the memory cell array.

5. The method of claim 4, wherein the power management circuit design comprises:
    a. a first control supply voltage design, adapted to produce the first control voltage power supply; and
    b. a second control supply voltage design, adapted to produce the second control voltage power supply;
    c. wherein the second control voltage power supply is a separate voltage supply with respect to the first control voltage power supply.

6. The method of claim 5, wherein the first control voltage power supply further comprises:
    a. a voltage supply; and
    b. a control signal.

7. The method of claim 6, wherein the voltage supply is a variable voltage supply to provide a substantially zero voltage.

8. The method of claim 5, wherein the second control voltage supply is a variable voltage supply, further comprising:
    a. allowing the second control voltage supply to operate in a minimum voltage level capable of sustaining data in the memory cell; and
    b. allowing the second control voltage supply to have a substantially zero voltage in a static mode.

9. An electronic circuit created using the process of claim 1.

10. A method of creating a design for a semiconductor memory, comprising:
    a. providing a leaf cell design for use by a memory compiler for a semiconductor memory, the leaf cell design further comprising a power management circuit design as a leaf cell for a memory circuit;
    b. acquiring a user input describing a parameter of a circuit, the circuit to comprise the leaf cell design;
    c. providing a user-selectable option to selectively allow enablement of an ultra low power feature; and
    d. creating a semiconductor memory design by the memory compiler which incorporates the power management circuit in a compiled semiconductor memory macro when the user-selectable option is enabled
    wherein the power management circuit design is adapted to provide a first control voltage power supply adapted to provide power to a circuit peripheral to a memory cell array and to provide a second control voltage power supply adapted to provide power to the memory cell array providing the control supply voltage of the memory periphery circuit with a netlist identifier which is unique with respect to a netlist identifier for the control supply voltage of the memory cell,
    wherein the power management circuit design comprises:
        (i) a first control supply voltage design, adapted to produce the first control voltage power supply; and
        (ii) a second control supply voltage design, adapted to produce the second control voltage power supply;
        (iii) wherein the second control voltage power supply is a separate voltage supply with respect to the first control voltage power supply.

* * * * *